(12) United States Patent
Baillet et al.

(10) Patent No.: US 8,828,872 B2
(45) Date of Patent: *Sep. 9, 2014

(54) METHOD FOR ETCHING A MATERIAL IN THE PRESENCE OF SOLID PARTICLES

(75) Inventors: Francis Baillet, Paladru (FR); Nicolas Gondrexon, Meylan (FR)

(73) Assignees: Institut Polytechnique de Grenoble, Grenoble Cedex (FR); Universite Joseph Fourier, Saint Matin d'Heres (FR)

( * ) Notice: Subject to any disclaimer, the term of this patent is extended or adjusted under 35 U.S.C. 154(b) by 78 days.

This patent is subject to a terminal disclaimer.

(21) Appl. No.: 13/320,618

(22) PCT Filed: May 12, 2010

(86) PCT No.: PCT/FR2010/050928
§ 371 (c)(1),
(2), (4) Date: Feb. 28, 2012

(87) PCT Pub. No.: WO2010/133787
PCT Pub. Date: Nov. 25, 2010

(65) Prior Publication Data
US 2012/0149196 A1    Jun. 14, 2012

(30) Foreign Application Priority Data
May 18, 2009 (FR) ..................................... 09 53294

(51) Int. Cl.
*H01L 21/302* (2006.01)

(52) U.S. Cl.
USPC ........ 438/689; 252/79.1; 252/79.2; 252/79.3; 252/79.4; 216/63; 156/345.11

(58) Field of Classification Search
USPC .............. 216/63; 252/79.1–79.4; 156/345.11; 438/689
See application file for complete search history.

(56) References Cited

U.S. PATENT DOCUMENTS 5,823,210 A * 10/1998 Inada et al. .................... 134/105
7,037,351 B2 * 5/2006 Li et al. ............................ 51/298

(Continued)

FOREIGN PATENT DOCUMENTS

JP 61235584 A 10/1986
JP 2097500 A 4/1990

(Continued)

OTHER PUBLICATIONS

Form PCT/ISA/210, WO, Oct. 8, 2010, ISR for PCT/FR2010/050928.

*Primary Examiner* — Nadine Norton
*Assistant Examiner* — Maki Angadi
(74) *Attorney, Agent, or Firm* — Edwards Wildman Palmer LLP; Steven M. Jensen; Stephen M. Rafferty

(57) ABSTRACT

The invention relates to a method for etching a structure (1) including at least one material (4) to be etched, said method consisting in: selecting at least one chemical species that can react with the material (4) to be etched; selecting at least one soluble compound that can release this chemical species; producing a solution (11) containing the compound and a powder of particles or solid grains (13) in suspension; placing the material to be etched in the presence of the solution; and producing high-frequency ultrasounds in the solution, at at least one frequency, capable of generating active cavitation bubbles such that the chemical species is generated and reacts with the material to be etched, thereby producing a soluble compound or a precipitate.

14 Claims, 1 Drawing Sheet

(56) References Cited

U.S. PATENT DOCUMENTS

| | | | |
|---|---|---|---|
| 7,931,786 B2 * | 4/2011 | Wilson et al. | 204/273 |
| 8,440,092 B2 * | 5/2013 | Baillet et al. | 216/83 |
| 2004/0226654 A1 * | 11/2004 | Hongo et al. | 156/345.11 |
| 2004/0259366 A1 * | 12/2004 | Kim et al. | 438/691 |

FOREIGN PATENT DOCUMENTS

| | | |
|---|---|---|
| KR | 20030093522 A | 12/2003 |
| WO | 2009117642 A2 | 9/2009 |

* cited by examiner

METHOD FOR ETCHING A MATERIAL IN THE PRESENCE OF SOLID PARTICLES

CROSS-REFERENCE TO RELATED APPLICATIONS

This application is the U.S. national phase, pursuant to 35 U.S.C. §371, of PCT international application Ser. No. PCT/FR2010/050928, filed May 12, 2010, designating the United States and published in English on Nov. 25, 2010 as publication WO 2010/133787 A1, which claims the benefit of French Application Ser. No 0953294, filed May 18, 2009, the entire contents of each of which are expressly incorporated herein by reference.

BACKGROUND OF THE INVENTION

The present invention relates to the field of etching a material.

The present invention may relate more particularly to the field of the production semiconductor components, in which, during production, numerous steps are generally provided for selectively etching one material relative to another or others, to the field of recovering semiconductor substrates having defects, in which it is desired to remove a surface layer in order to recover a subjacent substrate, possibly already provided with a certain number of layers formed in a suitable way, and to the field of improving the surface state of a layer of a material.

Generally, when it is desired to remove a layer deposited on a substrate in a selective manner relative to another layer, after having possibly masked part of the layer to be removed if it is desired to remove only part thereof, two main methods exist in the field of the fabricating semiconductor components.

The first family of methods consists of "wet" etching in which the structure, one layer of which is to be etched, is immersed in an etchant, typically one based on hydrochloric or hydrofluoric acid. Several mixtures have been developed for allowing selective etching of one layer relative to another, for example a silicon oxide layer relative to a silicon nitride layer, a silicon oxide layer relative to silicon, or a metal layer relative to an insulating layer.

Within this family, document U.S. Pat. No. 6,746,967 describes a method for oxidizing nickel in an oxidizing solution at a controlled pH. Simply to accelerate oxidation, the presence of low-frequency ultrasound modifies the energy barrier necessary for the nickel to be etched by the solution.

The second family of methods, called "dry" etching, consists of placing the structure carrying the layer to be removed in a plasma containing etchants, for example radical species or active radicals of chlorine, fluorine, oxygen etc.

The second family of methods has many advantages compared with the first, notably from the fact that it permits anisotropic attack and that it often has better etching selectivity between two materials. However, it has the disadvantage of requiring complex equipment and, in the case where the layer to be etched is carried by a silicon substrate, of only making it possible to treat one or two silicon substrates at the same time. On the other hand, although the first family of methods is often impossible to put into practice when it is desired to perform highly selective etching of one material relative to another material, it has the advantage of allowing batch treatments, it being possible for many wafers to be placed in a boat and then immersed in the etching solution.

Various variants of these two families of methods are known to a person skilled in the art. For example, as regards the "wet" etching method, it is sometimes proposed to improve the result by applying an electric field between the material to be etched and the etching solution.

A third family of methods, more generally used for cleaning and degreasing surfaces, consists of immersing the surface in a cleaning bath, for example an alcohol bath, and of applying sound vibrations to the liquid medium at relatively low sound frequencies, usually of the order of 20 to 4.5 kHz. The vibrations then assist in detaching dirt particles from the surface to be cleaned.

In addition, in "wet" etching methods, mixers are normally used to circulate the etching liquid over the surface of the material to be etched, and possibly low-frequency sound waves, between 1 and 40 kHz, in order to improve mixing. For example, in document U.S. Pat. No. 4,544,066, the solution is agitated by low-frequency ultrasound in order to even out the reaction over the surface.

BRIEF SUMMARY OF THE INVENTION

One subject of the present invention is a method for etching a structure including at least, one material, to be etched.

There is proposed a method for etching a structure including at least one material to be etched, which comprises:
choosing at least one chemical species capable of reacting with the material to be etched;
choosing at least one soluble compound that does not react with said material but which is able to release the aforementioned chemical species;
producing a solution containing said compound and containing a powder of solid grains or particles in suspension;
placing the material to be etched in the presence of the solution; and
producing high-frequency ultrasound in the solution with at least one frequency capable of generating active cavitation bubbles in the presence of said powder of solid grains or particles, such that the chemical species is generated and reacts with the material to be etched, while producing a soluble compound or a precipitate.

In the context of the present invention, the term "chemical species capable of reacting with the material to be etched" is understood to mean an atomic chemical species and/or a molecular chemical species and/or an ionic chemical species and/or a radical chemical species.

The size of the particles may be similar to the mean size of the active cavitation bubbles.

The solid particles may exhibit a hardness greater than the hardness of the material to be etched.

At least some of the solid particles may exhibit sizes close to or less than the sizes of the defects of the surface of the material to be etched.

At least some of the solid particles may exhibit sizes less than the sizes of holes made in the material to be etched.

The ratio between said sizes may be less than a fifteenth.

The size of the particles may be less than one micron.

The surface of the material, to be etched may be immersed in the solution.

The high-frequency ultrasound frequency may lie between 100 kHz and 3 MHz.

The high-frequency ultrasound frequency may lie between 200 kHz and 600 kHz.

For the selective etching of a structure comprising at least one first material to be etched and at least one second material, in which the chosen chemical species and the soluble compound may not react with the second material.

The period during which high-frequency ultrasound is produced may be determined in order totally or partially to remove the material, to be etched, in order to reduce the surface roughness of the material to be etched or in order to reduce the thickness of the material to be etched.

DETAILED DESCRIPTION OF THE INVENTION

The present invention will now be described in greater detail through the description of particular embodiments, as nonlimiting examples, in relation to items of etching equipment represented diagrammatically in the appended drawing, in which:

Figure 1:
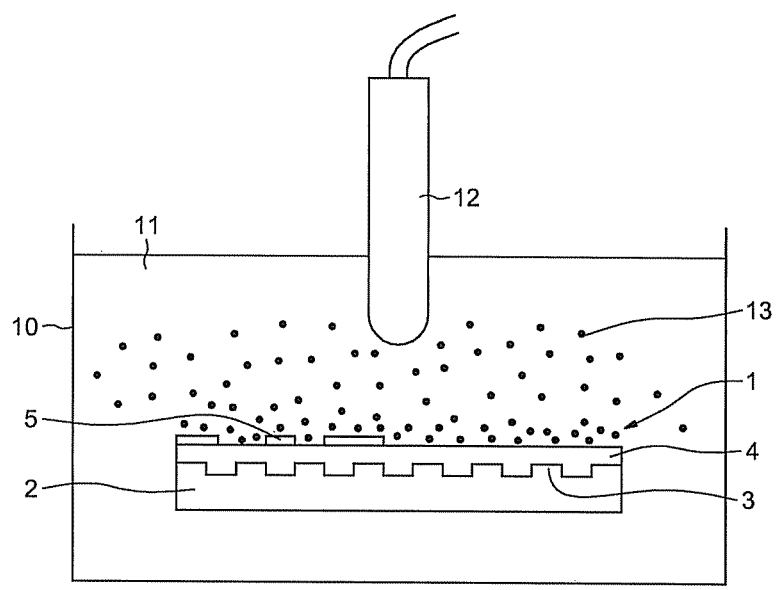
FIG. 1 represents a vertical cross section of an item of equipment, a structure to be etched being placed above a solution.

An item of equipment has been represented in FIG. 1 which comprises a basin or chamber 10 which contains a liquid solution 11 and an ultrasound emitter 12 or other source of sound waves, at least partially introduced into the solution 11, capable of generating high-frequency ultrasonic waves in the solution 11.

The solution 11 contains, in suspension, a powder of solid grains or particles 13.

A structure 1 including a material to be etched is at least partially immersed in the solution 11.

A description will now be given of examples relating to materials to be etched and solutions suitable for the etching of materials relative to other materials not to be etched.

In these examples, for writing reasons, the chemical species capable of reacting, which could have been marked by a "point", are marked by a superscript "o".

Example 1

An immersed structure 1 has been represented in the figure in the form of a wafer comprising a silicon substrate 2 coated with an insulating layer 3, for example a layer of silicon oxide etched in a certain pattern so as to exhibit inequalities in thickness, for example in a checkered pattern, and covered with a layer of copper 4. Normally, in practice, an intermediate tie layer, for example a layer of titanium nitride TiN, is deposited at the interface between the oxide layer 3 and the copper layer 4.

As an example of the order of magnitude, the silicon wafer 1 may have a thickness of several hundreds of µm, the oxide layer 2 may have a thickness less than 25 µm and for example a thickness less than 0.1 µm in its thinner parts, and the copper layer may have a thickness of the order of 1 µm.

In a variant shown in the right-hand part of the wafer, an attempt may be made to remove the copper layer 3 completely so as to recover the subjacent substrate.

According to another variant shown on the left hand part of the wafer, an attempt may be made to remove part of the layer 3 locally that is unprotected by a mask 5, in order to perform an intermediate step for producing a semiconductor device.

In order to etch the copper layer 4 of the structure 1 immersed in the solution 11, it is possible to make the following choices.

A solution 11 may be chosen containing molecules that do not etch copper or silicon or the mask and are capable of releasing a chemical species capable of reacting with copper without this chemical species reacting with silicon and with the material of which the mask is made.

High-frequency sound waves may be chosen that are able to generate active cavitation bubbles, namely sound waves having a frequency above 100 kHz, for example between 100 kHz and 3 MHz, preferably between 200 kHz and 3 MHz, and even more preferably of the order of 200 to 600 kHz. Within these frequency ranges, the size of the active cavitation bubbles may reach values of the order of 1 µm for frequencies of the order of 400 kHz and fall again to values of the order of 0.1 µm for frequencies of the order of 1 MHz.

According to a particular example, in order to attack the copper layer 4, a solution of HCl may be chosen at 1 mole per liter and an ultrasound emitter 12 may be chosen providing sound waves at a frequency of the order of 400 kHz and at a power of the order of 300 watts.

Under these conditions, active cavitation bubbles that have a very short lifetime, in which the pressures may reach values of the order of several atmospheres and the temperatures may be close to several thousands of degrees, are generated, notably and more particularly at the surface of the wafer 1, and bring about the formation of the radical chemical species Cl° from molecules of HCl. The chemical species Cl° produced reacts with copper, producing $CuCl$ or $CuCl_2$.

The etching obtained is quite specific to the phenomenon of creating the active chemical species Cl°. In point of fact, copper in contact with an HCl solution with the same concentration does not react.

For the thicknesses indicated above, complete removal of the metallic cooper layer 4 could be obtained, totally or locally, without the silicon oxide layer 3 being etched, that is to say without etching that could be greater than approximately one nanometer.

Example 2

Using a structure 1 including a silicon wafer 2 carrying a silicon oxide layer 4, an attempt may be made to remove this silicon oxide layer.

This wafer 1 is placed in a solution 11 of NaOH (sodium hydroxide) at 1 mole per liter and sound waves at a frequency of the order of 400 kHz and a power of the order of 300 watts are emitted into this solution.

Under these conditions, as in the previous example, active cavitation bubbles generated in the solution, notably and more particularly at the surface of the wafer 1, bring about the formation of the chemical species OH° from NaOH molecules. The radical chemical species OH° produced reacts with silicon oxide producing $H_2SiO_4$.

The layer of silicon oxide may be removed without any etching of the subjacent silicon.

Example 3

Using a silicon wafer carrying a copper layer as in example 1 or a layer of silicon oxide as in example 2, an attempt may be made to reduce the roughness of the surface of this layer.

To this end, the conditions of example 1 or of example 2 may for example be employed respectively, but the action of the ultrasound emitter 12 is limited in duration, for example to a few seconds, so that only the material constituting the rough regions or asperities is at least partially etched.

Attack of the rough regions is more effective as the density of the active cavitation bubbles increases at the ends of these rough regions or asperities.

Example 4

Using a wafer 1 having a copper layer as in example 1 or a silicon oxide layer as in example 2, an attempt may be made to reduce the thickness of this layer.

To this end, it is possible to employ for example the conditions of example 1 or of example 2, but the duration of the action of the high-frequency ultrasound emitter 12 is limited and controlled so that the remaining thickness of the layer reaches a desired value.

Considering the previous examples, a more specific description will, now follow of the selective etching of a first material 4 relative to a second material 2 of a structure 1, while making the following provisions.

A chemical species is chosen that is capable of reacting with the first material, to be etched and of not reacting with the second material.

A soluble compound is chosen that does not etch the materials and is capable of releasing the selected chemical species.

Having prepared a solution containing this compound and having immersed the structure in the solution, ultrasound is produced in the solution, at a frequency capable of generating active cavitation bubbles.

The result is that active cavitation bubbles, in which pressures reach values of the order of several atmospheres and the temperature approaches several thousands of degrees, bring about the production, in the solution and notably in the vicinity of the solid surface to be treated, of the chosen chemical species that reacts selectively with the first material producing a soluble compound or precipitate, without etching the second material.

In order to select the suitable chemical species and the suitable soluble compound, a person skilled in the art will know how to use for example the "FactSage" software containing the European SGTE database so as to determine a chemical species likely to react with a first material to produce a soluble compound or one that can easily crumble away, or a precipitate, this chemical species not reacting with a second material.

The SGTE database is not the only thermodynamic database available to a person skilled in the art. Other existing bases exist such as for example the "Thermo-Calc" software. In order to access the "Thermo-Calc" or "FactSage" software, it is sufficient to connect to the following websites: http://www.thermocalc.com; www.factsage.com; www.gtt-technologies.com.

These bases serve to support software programs which, by minimizing the Gibbs energy, are capable of giving thermodynamically stable compounds that will be formed by chemical reaction from a given starting mixture. "Thermodynamically stable" is understood to mean a product that would be obtained after an infinite reaction time. The following may for example be observed.

- a starting mixture of silica+solid copper+HCl diluted to 1 mole per liter does not change (remains stable). If it is added into the calculation that Cl° radicals or radical species exist in solution, solid copper will be transformed completely into $CuCl_2$ and $Cu^{2+}$ but silica will not change;
- a starting mixture of silicon silica and sodium hydroxide at 1 mole per liter is a thermodynamically stable mixture (no change). If it is added to the calculation that the radical chemical species OH° or Na° are to be formed in solution, the thermodynamic software shows that silica will be converted into the solid compound $Na_2SiO_4$ while silicon will remain stable.

A person skilled in the art will know how to determine what chemical species may form in a given solution and how to test, by using the abovementioned software, what phases (compounds or pure bodies) will be stable in solution and which will change by chemical reaction.

The following examples may be noted for choosing a chemical species intended to etch a first material without etching a second material of a wafer.

The chemical species OH° may be active for etching Si, without etching SiGe.

The chemical species H° may be active for etching $InSnO_3$, without etching $SiO_2$.

The chemical species Cl° may be active for etching Cu, without etching $SiO_2$.

The chemical species F° may be active for etching Si, without etching a polymer.

The chemical species Cl° may be active for etching Au, without etching an AlN ceramic.

The chemical species OH° or the chemical species Cl° may be active for etching Al, without etching $Al_2O_3$.

The chemical species OH° may be active for etching without etching $Al_2O_3$.

The chemical species Cl° may be active for etching Cu, without etching $SiO_2$ or a TiN ceramic.

The chemical species H° or the chemical species Cl° may be active for etching $InSnO_2$, without etching a polymer or a glass.

The chemical species Na° or the chemical species F° may be active for etching $SiO_2$, without etching Al.

The chemical species H° or the chemical species F° may be active for etching $Al_2O_3$, without etching W.

The chemical species Br° may be active for etching TiN, without etching $SiO_2$.

The chemical species may be active for etching $Si_3N_4$, without etching SiO or a polymer.

The chemical species Cl° may be active for etching a TaN ceramic, without etching $SiO_2$.

In addition, a person skilled in the art will know, by simple tests, how to determine in each particular case the concentration of the chosen solution, the optimum frequency and optimum power of the ultrasound so that the effect of the active cavitation bubbles produced will bring about the desired etching, as well as the duration of treatment to be applied to the first material to be etched.

Note may be taken of the great simplicity of the implementing method as well as the fact that a batch of structures 1 may be treated simultaneously in the same solution.

Figure 2:
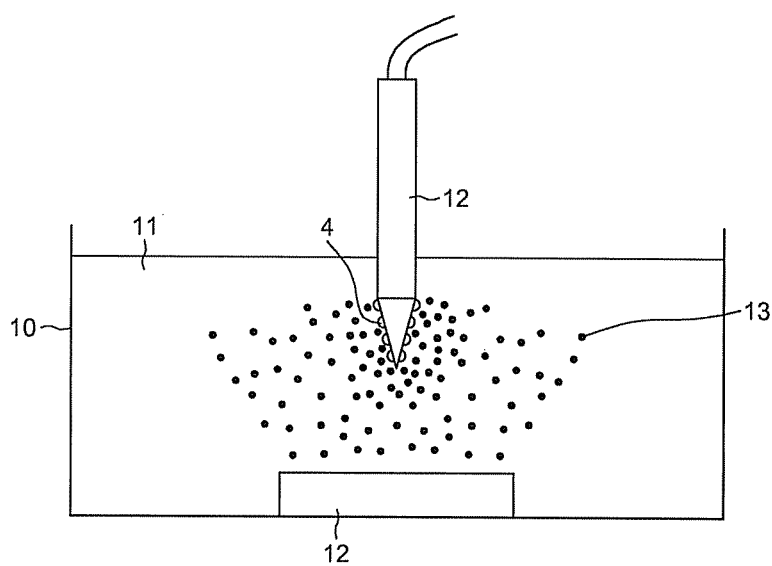
FIG. 2 represents a vertical cross section of an item of equipment, a structure to be etched being immersed in a solution.

In another example represented in FIG. 2, the proposal is made to carry out the cleaning of the ends of electrical contact points 2 tarnished by a deposit of particles 4 to be removed, in particular the chemical etching of aluminum particles deposited on tungsten probes used for testing electronic chips, the tarnished ends of the points being dipped into a solution 11. In this case, an NaCl solution may be chosen which etches neither aluminum nor tungsten but which could release Cl° chemical species in order to etch the aluminum without etching the tungsten.

In all the etching examples which have just been described, the powder of solid particles 13 may be chosen in order to provide the following effects.

The solid particles 13 in suspension in the solution 11 may act as seeds for the creation of active cavitation bubbles. Consequently, the presence of the solid particles 13 in suspension in the solution 11, in particular close to the surface of the material to be etched 4, may make it possible to increase the number of active cavitation bubbles created under the effect of high-frequency ultrasound.

This increase in the number of active cavitation bubbles may make possible an increase in the number of chemical species released, which may have the effect of accelerating the chemical etching of the material to be etched.

A consequent increase happens insofar as the size of the solid particles 13 is close to or smaller than the size of the active cavitation bubbles created. In particular, the size of the solid particles 13, for at least the majority of them, may be in the vicinity of or less than 0.5 micron.

The solid particles 13 in suspension in the solution 11 may be stirred under the effect of the high-frequency ultrasound and may undergo displacements under the effect, in particular of the implosion of the active cavitation bubbles and of the associated hydrodynamic effects. Consequently, the solid particles which undergo these displacements and which are situated close to or in contact with the surface of the material to be etched may bring about mechanical microabrasion of this surface.

Firstly, this abrasion may also contribute to accelerating the chemical etching of the material to be etched.

Secondly, this abrasion may produce a polishing effect on the surface of the material to be etched, by etching the asperities of this surface. This abrasion may also produce a polishing effect on the walls of holes made in the surface of the material to be etched.

In order for such an abrasion to be effective, the solid particles 13 may exhibit a hardness greater than the hardness of the material to be etched in order for the solid particles 13 not to be damaged and to produce their abrasive effect. Depending on the material 4 to be etched, the choice may advantageously concern particles of silicon carbide (SiC), alumina ($Al_2O_3$), silica ($SiO_2$) or zirconia ($ZrO_2$). In the case of a glass to be etched or polished, silicon carbide (SiC) would be particularly suitable.

Furthermore, the size of the solid, particles 11, for at least the majority of them, may be in the vicinity of the size of the hollows between the surface asperities. However, in the case where it is desired to polish or clean the walls of holes made in the surface of the material to be etched, it may be advantageous for the size of the solid particles, for at least the majority of them, to be in the vicinity of or less than one tenth of the size of the holes in order to easily penetrate therein. For holes with a diameter of a micron, solid particles 13 of a tenth of a micron or less would be suitable.

In all cases, the solid particles 13 must, for at least the majority of them, be in suspension in the solution 11 during the etching operation and must not separate by settling. In order to prevent such a separation by settling, stirring of the solution 11 by an appropriate means may be added.

The density of the solid particles 13 in the solution 11 may in addition be adjusted to the desired effects. In particular, in order to obtain a significant effect, it may be judicious for at least from 15 to 20 particles to be present between two asperities. As the abrasive action is isotropic (in all directions), the points of the asperities may be more etched and the surface defects may be reduced.

The invention claimed is:

1. A method for etching a structure comprising at least one material to be etched, comprising:
    choosing at least one chemical species capable of reacting with the material to be etched;
    choosing at least one soluble compound that does not react with said material but which is able to release the aforementioned chemical species;
    producing a solution containing said compound and containing a powder of solid grains or particles in suspension;
    placing the material to be etched in the presence of the solution; and
    producing high-frequency ultrasound in the solution with at least one frequency capable of generating active cavitation bubbles in the presence of said powder of solid grains or particles, such that the chemical species is generated and reacts with the material to be etched, while producing a soluble compound or a precipitate.

2. The method as claimed in claim 1, in which the size of the particles is similar to the mean size of the active cavitation bubbles.

3. The method as claimed in claim 2, in which the solid particles exhibit a hardness greater than the hardness of the material to be etched.

4. The method as claimed in claim 1, in which the solid particles exhibit a hardness greater than the hardness of the material to be etched.

5. The method as claimed in claim 1, in which at least some of the solid particles exhibit sizes close to or less than the sizes of the defects of the surface of the material to be etched.

6. The method as claimed in claim 5, in which the ratio between said sizes is less than a fifteenth.

7. The method as claimed in claim 1, in which at least some of the solid particles exhibit sizes less than the sizes of holes made in the material to be etched.

8. The method as claimed in claim 7, in which the ratio between said sizes is less than a fifteenth.

9. The method as claimed in claim 1, in which the size of the particles is less than one micron.

10. The method as claimed in claim 1, in which the surface of the material to be etched is immersed in the solution.

11. The method as claimed in claim 1, in which the high-frequency ultrasound frequency lies between 100 kHz and 3 MHz.

12. The method as claimed in claim 1, in which the high-frequency ultrasound frequency lies between 200 kHz and 600 kHz.

13. The method as claimed in claim 1, for the selective etching of a structure comprising at least one first material to be etched and at least one second material, in which the chosen chemical species and the soluble compound do not react with the second material.

14. The method as claimed in claim 1, in which the period during which high-frequency ultrasound is produced is determined in order totally or partially to remove the material to be etched, in order to reduce the surface roughness of the material to be etched or in order to reduce the thickness of the material to be etched.

* * * * *